United States Patent [19]

El Hamamsy et al.

[11] 4,322,767
[45] Mar. 30, 1982

[54] BIDIRECTIONAL SOLID-STATE PROTECTOR CIRCUITRY USING GATED DIODE SWITCHES

[75] Inventors: Mahmoud A. El Hamamsy, Watchung; William C. King, Chatham Township Morris County; Stephen Knight, Berkeley Heights, all of N.J.

[73] Assignee: Bell Telephone Laboratories, Incorporated, Murray Hill, N.J.

[21] Appl. No.: 120,281

[22] Filed: Feb. 11, 1980

Related U.S. Application Data

[63] Continuation-in-part of Ser. No. 972,057, Dec. 20, 1978, abandoned.

[51] Int. Cl.³ ............................................. H02H 3/20
[52] U.S. Cl. ............................................. 361/56; 361/91; 361/111; 307/252 R; 307/252 C; 307/252 T
[58] Field of Search ........................ 361/56, 91, 54, 55, 361/88, 90, 86, 111, 110; 307/252 R, 252 T, 252 C, 252 G, 252 A, 252 H, 248, 239

[56] References Cited

U.S. PATENT DOCUMENTS

| | | | |
|---|---|---|---|
| 3,213,349 | 10/1965 | Gutzwiller | 361/56 X |
| 3,328,606 | 6/1967 | Pinckaers | 307/252 T |
| 3,423,635 | 1/1969 | Moe | 361/56 X |
| 3,486,042 | 12/1969 | Watrous | 307/252 T |
| 3,660,724 | 5/1972 | Berger | 361/56 |
| 3,878,434 | 4/1975 | Voorhoeve | 361/111 X |
| 4,020,395 | 4/1977 | Erickson et al. | 361/111 X |

*Primary Examiner*—Patrick R. Salce
*Attorney, Agent, or Firm*—Irwin Ostroff

[57] ABSTRACT

An all solid-state protector circuit utilizes the combination of four zener diodes (Z1, Z2, Z3, Z4), two resistors (R1, R2), two capacitors (C1, C2), and two gated diode type switches (GDSA, GDSB) and provides bilateral voltage surge protection.

9 Claims, 6 Drawing Figures

BIDIRECTIONAL SOLID-STATE PROTECTOR CIRCUITRY USING GATED DIODE SWITCHES

CROSS-REFERENCE TO RELATED APPLICATION

This application is a continuation-in-part of our co-pending application, Ser. No. 972,057, filed Dec. 20, 1978, now abandoned.

TECHNICAL FIELD

This invention relates to protection circuitry and, more particularly, to solid-state bidirectional voltage overload protection circuitry.

BACKGROUND OF THE INVENTION

Copending U.S. patent application Ser. No. 972,055 (A. R. Hartman-R. S. Scott-P. W. Shackle) discloses a prior invented solid-state protection circuitry comprising the combination of a gated diode switch, a zener diode, a resistor, and a capacitor. This circuitry is capable of providing voltage overload protection against voltage surges of one polarity of several hundred volts and at least several amperes and is relatively insensitive to changes in voltage with respect to time (dv/dt) until the magnitude of the voltage reaches a preselected level.

There have recently become available new forms of solid-state switches which can be operated at high voltages and at high currents. Switches of this kind are disclosed in U.S. patent application Ser. Nos. 972,056 (A. R. Hartman-T. J. Riley-P. W. Shackle), 971,886 (A. R. Hartman-B. T. Murphy-T. J. Riley-P. W. Shackle), and 972,021 (A. R. Hartman-A. U. Mac Rae-P. W. Shackle).

It is desirable to have solid-state circuitry which has the features of the above-described circuitry but which, in addition, is capable of providing protection against voltage surges of either polarity.

SUMMARY OF THE INVENTION

The present invention involves the use of the type of solid-state switches as described above to achieve bidirectional overload protection circuitry capable of high voltage and high current operation. In one embodiment, two of such switches are interconnected with four zener diodes, or functionally equivalent devices, and two resistor elements. In particular, an illustrative circuit includes two gated diode switches with the gates being connected together to the cathode of the first and second diodes and with the anodes of the first and second switches being connected to the anodes of the third and fourth diodes, respectively. The cathodes of the third and fourth diodes are connected to first and second circuit terminals, respectively. The first resistor is connected between the first circuit terminal and the anode of the first diode. The second resistor is connected between the second circuit terminal and the anode of the second diode.

The circuitry of the present invention is all solid-state and is adapted to perform a voltage overload protection function independent of the polarity of the overload and independent of which of the terminals experiences the overload.

These and other features and advantages of the present invention are better understood from consideration of the following detailed description taken in conjunction with the accompanying drawing.

DETAILED DESCRIPTION

Figure 1:
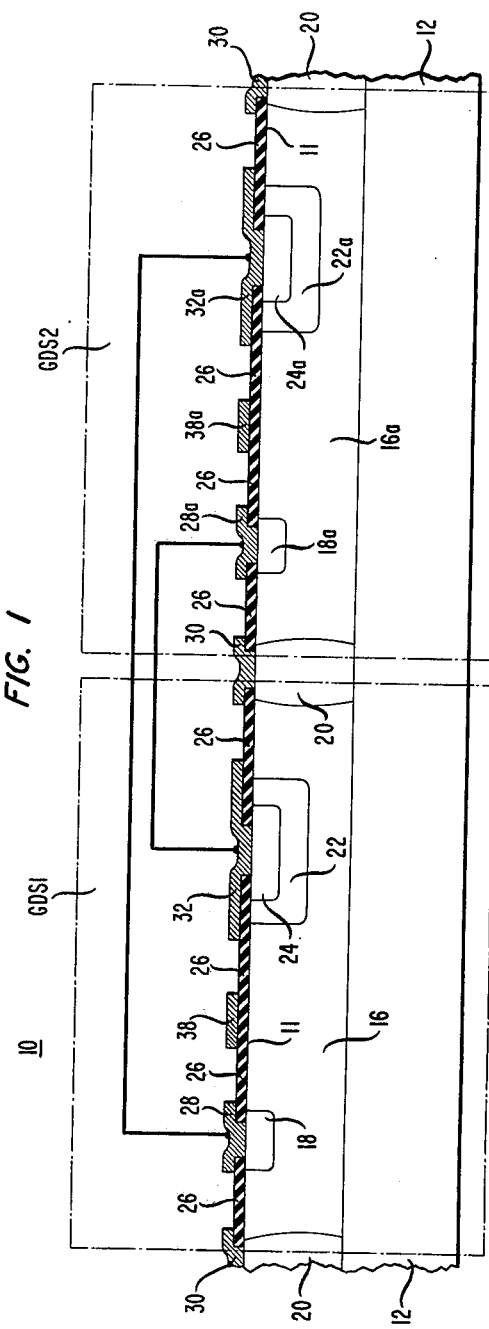
FIG. 1 illustrates a structure.
Figure 2:
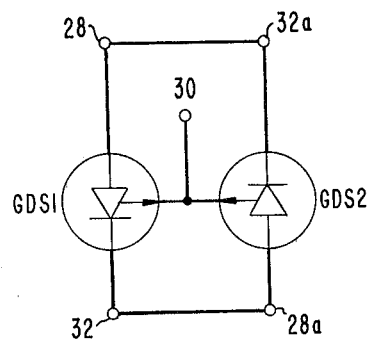
FIG. 2 illustrates a proposed electrical symbol for the structure of FIG. 1.
Figure 3:
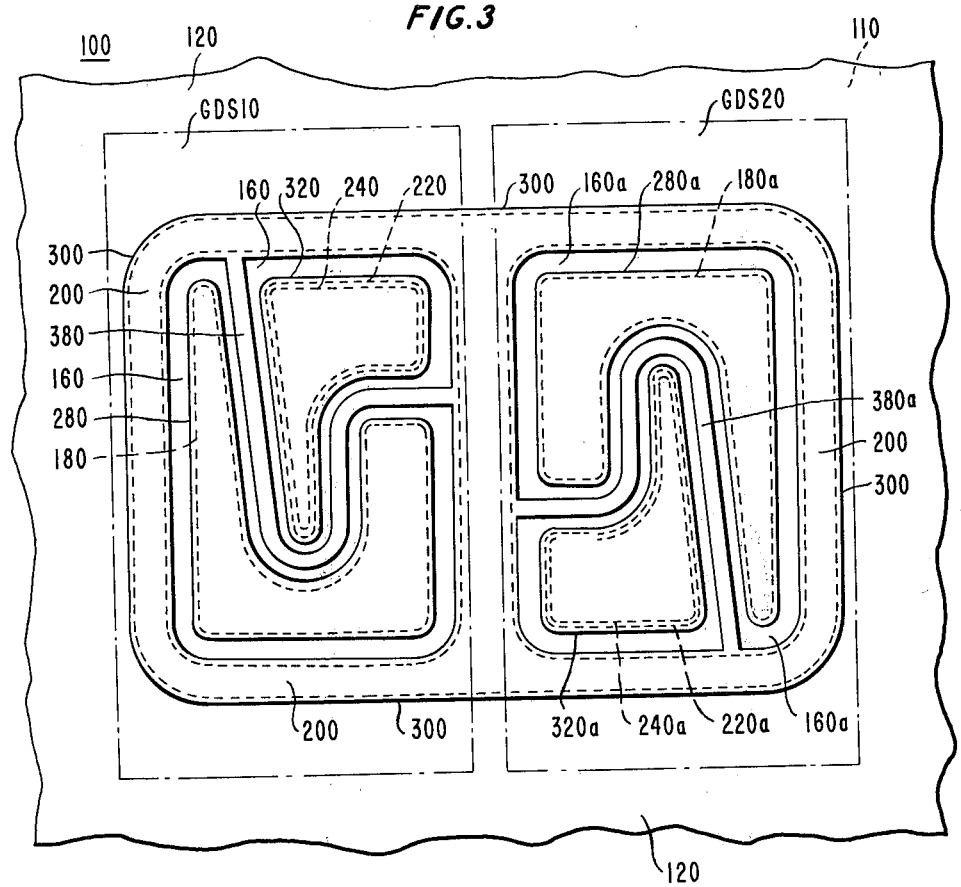
FIG. 3 illustrates a top view of another structure.

The structures and electrical symbol of FIGS. 1, 2, and 3 herein are also illustrated and described in U.S. patent application Ser. Nos. 971,886 and 107,773, which were filed Dec. 20, 1978 and Dec. 28, 1979, respectively, and have a common assignee with the present application.

Referring now to FIG. 1, there is illustrated a semiconductor structure 10 comprising two essentially identical gated diode switches GDS1 and GDS2 which are illustrated within dashed line rectangles and are both formed in a semiconductor wafer (substrate) 12. Semiconductor structure 10 has a major surface 11. Substrate 12 is of the one conductivity type and acts as a common gate and support for GDS1 and GDS2.

An epitaxial layer of the opposite conductivity type of substrate 12 is isolated by semiconductor regions 20 into semiconductor bodies 16 and 16a. A plurality of bodies 16, 16a can be formed on substrate 12 instead of just the two illustrated. Regions 20 are of the same conductivity type as substrate 12 but have higher impurity concentration and extend from major surface 11 down to substrate 12. Within body 16 is also included a semiconductor anode region 18 of the same conductivity type as body 16 but of higher impurity concentration and a semiconductor region 22 of the same conductivity type as body 16 but of lower resistivity than body 16. A semiconductor cathode region 24 is included in a portion of region 22 and has a portion which extends to major surface 11. Region 24 is of the same conductivity type and essentially the same impurity concentration as regions 20. Electrodes 28, 32, and 30 make low resistance contact to regions 18, 24, and 20, respectively. Region 20 makes low resistance contact to substrate 12. Thus, electrode 30 makes low resistance contact to substrate 12 and serves as a common gate electrode for GDS1 and GDS2. Accordingly, substrate 12 serves as a common gate region for GDS1 and GDS2. A region 38, which is optional and can be a metal or semiconductor material, is located between anode electrode 28 and cathode electrode 32. Region 38 is electrically coupled to the substrate by an electrical connection to electrode 30.

Body 16a has contained therein semiconductor regions 18a, 22a, and 24a. Electrodes 28a, 32a, and 30 are coupled to regions 18a, 22a, and 24a, respectively. These regions are essentially the same as the corresponding regions of body 16. An insulator layer 26 electrically isolated all of the above-described electrodes from portions of structure 10, except those portions which are meant to be electrically contacted.

In one illustrative embodiment, substrate 12 is of n type conductivity, regions 20 and 24 (24a) are of n+ type conductivity, body 16 (16a) is of p- type conductivity, region 18 (18a) of p+ type conductivity, region 22 (22a) is of p type conductivity and of lower resistivity than body 16 (16a), and electrodes 28 (28a), 32 (32a), and 30 are aluminum. In this embodiment anode electrode 28 is electrically coupled to cathode electrode 32a, and cathode electrode 32 is coupled to anode electrode 28a.

Proposed electrical symbols for GDS1 and GDS2 are illustrated in FIG. 2. The anode, cathode, and gate electrode terminals of GDS1 are 28, 32, and 30, respectively. The corresponding terminals of GDS2 are 28a, 32a, and 30. This combination of GDS1 and GDS2 acts as a bidirectional switch which is capable of bilateral blocking of potentials independent of whether the anode or cathode of either gated diode switch is at the more positive potential.

GDS1 and GDS2 are both essentially identical and operate in essentially the same manner. Accordingly, the below description of GDS1 is equally applicable to GDS2. GDS1 is characterized by a relatively low resistance path between anode region 18 and cathode region 24 when in the ON (conducting) state and by a substantially higher impedance when in the OFF (blocking) state. In the ON state the potential of the gate electrode 30 is typically at or below that of the potential of anode 28. Holes are injected into body 16 from anode region 18 and electrons are injected into body 16 from cathode region 24. These holes are electrons can be in sufficient numbers to form a plasma which conductivity modulates body 16. This effectively lowers the resistance of body 16 such that the resistance between anode region 18 and cathode region 24 is relatively low when GDS1 is operating in the ON state. This type of operation is denoted as dual carrier injection. The type of structure described herein is denoted as a gate diode switch (GDS).

Region 22 helps limit the punch-through of a depletion layer formed during operation between region 20 and substrate 12 and cathode region 24. Region 22 also helps inhibit formation of a surface inversion layer between regions 24 and 20. In addition, it allows anode region 18 and cathode region 24 to be relatively closely spaced. This results in relatively low resistance between anode region 18 and cathode region 24 during the ON state. The spacing between anode region 18 and cathode region 24 can be less than the corresponding spacing of anode 18 and cathode 24 of FIG. 1 of copending U.S. patent application Ser. No. 972,056, which was filed Dec. 20, 1978 and has a common assignee with the present application.

Conduction between anode region 18 and cathode region 24 is inhibited or cut off if the potential of gate electrode 30 is sufficiently more positive than that of anode electrode 28, cathode electrode 32, and region 22. The amount of excess positive potential needed to inhibit or cut off conduction is a function of the geometry and impurity concentration levels of structure 10. This positive gate potential causes a cross-sectional portion of body 16 between gate region (substrate) 12 and the portion of oxide layer 26 thereabove to be depleted and the potential of this portion of body 16 to be more positive than that of the anode region 18, cathode 24, and region 22. This positive potential barrier inhibits the conduction of holes from anode region 18 to cathode region 24. It also serves to collect electrons emitted at cathode region 24 before they can reach anode region 18. This essentially pinches off body 16 against dielectric layer 26 in the bulk portion thereof which is between the anode and cathode regions (18, 24) and extends from substrate 12 to dielectric layer 26. The blocking (nonconducting) state is the OFF state. Control circuitry capable of supplying the needed gate potentials and absorbing the electrons (by providing the necessary positive charge into the gate) is illustrated and described in U.S. patent application Ser. No. 972,023, which was filed Dec. 20, 1978, and which has a common assignee.

The use of region 38 reduces the magnitude of the potential needed to inhibit or cut off conduction. In the OFF state GDS1 is capable of bilateral blocking of relatively large potentials between anode and cathode regions, independent of which region is at the more positive potential.

During the ON state of GDS1, the p-n junction diode comprising body 16 and region 20 becomes forward-biased. Current limiting means (not illustrated) are used to limit the conduction through the forward-biased diode. One example of such current limiting means is illustrated and described in copending U.S. patent application Ser. No. 972,023.

The ON state can be achieved by forward-biasing the anode region 18 with respect to the gate region (substrate) 12 and drawing several microamperes out of the forward-biased anode-gate junction.

It is possible to operate structure 10 in the ON state with the potential of gate region (sbustrate) 12 at the same or a more positive level than that of anode region 18, cathode region 24, and region 22, so long as the potential applied to gate region (substrate) 12 is below a level which essentially completely depletes a vertical cross-sectional portion of semiconductor body 16 between anode region 18 and cathode region 24. With the gate region (substrate) 12 held at such a potential level, the junction diode comprising semiconductor body 16 and gate region (substrate) 12 has a zero forward-bias or is reverse-biased.

GDS1 and GDS2 need not have the anodes and cathodes connected together. GDS1 and GDS2 can be used individually but the gates are common.

Referring now to FIG. 3, there is illustrated a top view of a preferred embodiment of a dual GDS semiconductor structure 100 which has been fabricated. Structure 100 is similar to structure 10 except the anode and cathode regions are curved. This geometry tends to limit localized voltage field concentration which causes voltage breakdown and adds additional perimeter common to the anode and cathode regions in order to facilitate low ON resistance and thereby facilitate high current operation. Structure 100 has been fabricated on an n type substrate having a thickness of 18 to 22 mils and a conductivity of $10^{15}$ to $10^{16}$ impurities/cm$^3$. Bodies 160 and 160a are of p- type conductivity with a thickness of 30 to 40 microns, a width of 720 microns, a length of 910 microns, and an impurity concentration in the range of $5-9 \times 10^{13}$ impurities/cm$^3$. Curved anode regions 180 and 180a are of p+ type conductivity with a thickness of 2 to 4 microns, and an impurity concentration of $10^{19}$ impurities/cm$^3$. Curved cathode regions 240 and 240a are of n+ type conductivity with a thickness of 2 to 4 microns, and an impurity concentration of $10^{19}$ impurities/cm$^3$. The overall length and width of the fabricated circuit is 1910 microns by 1300 microns. The spacing between anode and cathode is typically 120 microns.

some of the fabricated structures contained conductor regions 380, 380a which were 60 microns wide and others did not. The structures fabricated without regions 380, 380a required a potential of 22 more volts on the gate than the anode to inhibit or cut off conduction between anode and cathode. The structures fabricated with conductor regions 380, 380a required the gate potential to have an excess of only 7.5 volts over the anode potential to effect turnoff. The fabricated structure was able to block 300 volts and conduct 500 milliamperes with a voltage drop between anode and cathode of 2.2 volts. This structure was able to operate under current surges of 10 amperes for a duration of one millisecond.

Figure 4:
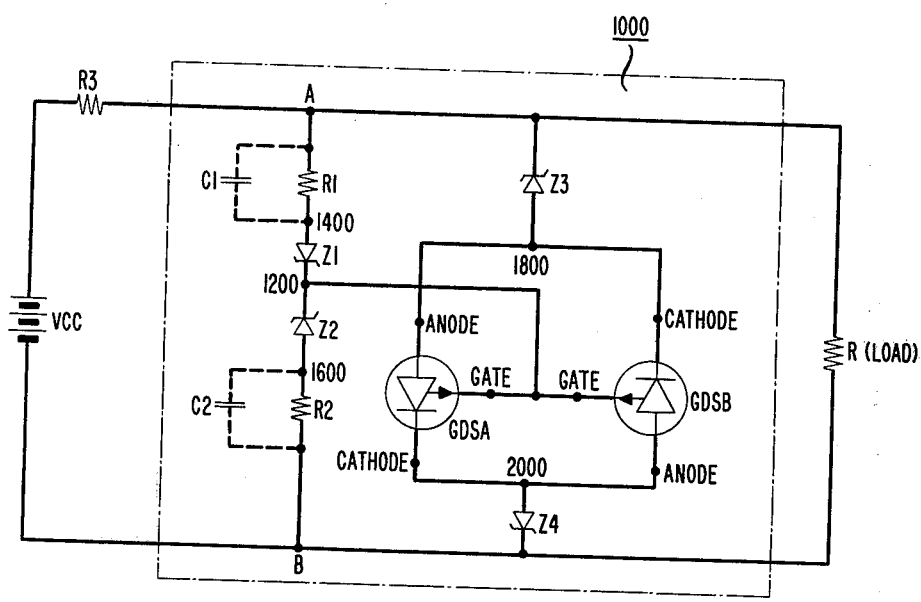
FIG. 4 illustrates an embodiment in accordance with the present invention.

Referring now to FIG. 4, there is illustrated within a dashed line rectangle protector circuitry 1000 coupled to terminals A and B and comprising zener diodes Z1, Z2, Z3, and Z4, resistors R1 and R2, gated diode switches GDSA and GDSB, which each have an anode, a cathode, and a gate, and capacitors C1 and C2 (shown in dashed lines). For illustrative purposes GDSA and GDSB are of the type illustrated in FIGS. 1 and 3 herein. A power source VCC is connected to one terminal of a resistor R3 which is connected by the other terminal to a load circuit R(Load) and to terminal A. VCC and R(Load) are both connected to terinal B. As will become clear from the below description, protector circuitry 10 acts to protect R(Load) from voltage overloads at terminals A or B, independent of the polarity of the overload.

R1, C1, and the cathode of Z3 are all coupled to terminal A. R2, C2, and the cathode of Z4 are all coupled to terminal B. R1 and the anode of Z1 are coupled to a terminal 1400, and R2 and the anode of Z2 are coupled to a terminal 1600. The cathodes of Z1 and Z2 and the gates of GDSA and GDSB are coupled to a terminal 1200. The anodes of GDSA and Z3 and the cathode of GDSB are coupled to a terminal 1800. The anodes of GDSB and Z4 and the cathode of GDSA are coupled to a terminal 2000. C1, which is optional, is connected between terminals A and 1400, and C2, which is also optional, is connected between terminals B and 1600.

The basic operation of a GDS is such that during an ON state there is conduction between anode and cathode and during an OFF state conduction between anode and cathode is cut off or inhibited. The potential of the gate relative to the anode and cathode determines the state of the GDS. If the gate potential is more positive than that of the anode and cathode potentials, by an amount which is characteristic of the switch, the GDS is in the OFF state; otherwise, the GDS is in the ON state.

Protector circuitry 1000 acts to dissipate voltage overloads (surges) of either polarity appearing at terminals A or B. If the potentials of terminals A and/or B are within preselected ranges, then GDSA and GDSB are in the OFF state and there is essentialy no conduction through circuitry 1000 between terminals A and B other than leakage current flow.

A malfunction in VCC can result in terminal A reaching a sufficiently positive potential level which will damage R(Load). As the potential of terminal A increases, the potentials of terminals 1800 (the anode of GDSA) and 1200 (the gate of GDSA) also increase. The ohmic values of R1, R2, and the breakdown voltage of Z2 and Z3 are selected to cause terminal 1800 to rise in potential with respect to terminal 1200 in response to terminal A reaching a positive potential level that can damage R(Load).

This causes GDSA to switch to ON state and causes Z3 to operate in avalanche breakdown. This results in Z4 being forward-biased. Terminal A becomes clamped to a potential above that of the potential of terminal B which is equal in value to the forward-bias voltage across Z4 plus the anode-cathode voltage of GDSA plus the breakdown voltage across the cathode-anode of Z3. Another conduction path from terminal A through R1, Z1, the gate-cathode of GDSA, and through the anode-cathode of Z4, and into terminal B is also established.

As VCC thereafter returns to the preselected nominal value, the current flowing through R1 and Z3 decreases. Terminal 1800 stays at essentially the same potential as long as Z3 continues to operate in avalanche breakdown. The potential of terminal 1200 increases proportionally with the decrease in current therethrough. This results in the potential of the gate of GDSA becoming sufficiently more positive than the anode and causes GDSA to switch to the OFF state and to thus cut off conduction between terminals A and B through circuitry 1000. Terminal A now returns to a potential within the preselected range.

If terminal A experiences a voltage overload (surge) of a negative polarity with respect to terminal B of a sufficient potential level to cause damage to R(Load), GDSB switches to the ON state. This clamps the potential of terminal A to a value equal to the breakdown voltage of Z4 plus the anode-cathode voltage of GDSB plus the forward voltage across the anode-cathode of Z3 below the potential of terminal B. After the voltage surge at terminal A is discharged, or the cause is eliminated (i.e., VCC ceases to malfunction), terminal A returns to a potential within the preselected range.

A positive or negative voltage overload (surge) appearing at terminal B with respect to terminal A would likewise result in GDSB or GDSA being switched to the ON state and thus clamping the voltage of terminal B relative to terminal A or terminal B relative to terminal B.

Voltage overloads (surges) appearing at terminal A or terminal B can be caused by power supply malfunctions, lightning, cross coupling from other circuitry (not illustrated), or other causes.

Capacitors C1 and C2, which are optional, serve to prevent protector circuitry 1000 from conducting in respone to a fast voltage change at terminals A or B in which the magnitude of the voltage change is less than a preselected value. This serves to increase the immunity of circuitry 1000 to rapid changes in voltage across terminals A and B which occur in relatively short times and limits GDSA and GDSB from switching to the ON state until the magnitude of the voltage at terminal A relative to terminal B reaches a preselected level.

In one embodiment that was built and tested, VCC (nominal) = +48 volts, R3 = 616 ohms ($\pm$10%), R(Load) = 496 ohms ($\pm$10%), R1 = R2 = 33,000 ohms ($\pm$10%), the reverse breakdown voltage (VBD) of Z1 = Z2 = 47 volts and of Z3 = Z4 = 18 volts. GDSA and GDSB are essentially the same as GDS10 and GDS20 of FIG. 3 herein. With these particular parameters, terminal A is at +21.1 volts and protector circuitry 1000 is designed to clamp the potential of terminals A and B if the potential difference between the two terminals exceeds approximately 55 volts.

VCC was incrementally increased in potential from +48 volts to +127 volts. This resulted in terminal A being increased from +21.1 volts to +55.03 volts. GDSA and GDSB were both essentially in the OFF state. The potential of VCC was then increased to +128 volts. Terminal A quickly dropped in potential to +20 volts and stayed at that potential level until VCC was returned to +48 volts. GDSA was in the ON state at this time and was conducting. VCC was then decreased in potential from +128 volts back to +48 volts. Terminal A then returned in potential to +21.1 volts and GDSA switched to the OFF state and ceased conducting.

Figure 5:
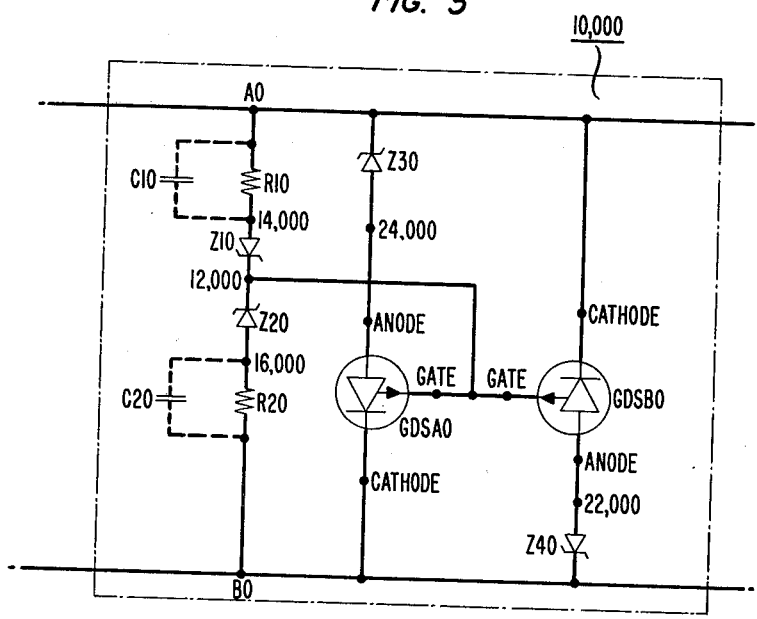
FIG. 5 illustrates a structure in accordance with another embodiment in accordance with the invention.

Referring now to FIG. 5, there is illustrated protector circuitry 10,000 which is very similar to protector circuitry 1000 of FIG. 4 and functions in essentially the same manner. Electrical components and terminals which are similar to corresponding components and terminals of circuitry 1000 of FIG. 4 have the same reference denotation with a "0" added thereto. The basic difference between circuitry 1000 and circuitry 10,000 is that the cathodes of GDSA0 and GDSB0 are coupled directly to terminals B0 and A0, respectively, and not to the anodes of Z40 and Z30. This results in the potential across terminals A0 and B0 being less than the potential across terminals A and B of circuitry 1000 of FIG. 4 when both circuitry 1000 and 10,000 are clamping the potentials of their respective terminals. The anodes of GDS10 and Z30 are coupled to a terminal 24,000 and the anodes of GDS20 and Z40 are coupled to a terminal 22,000.

Figure 6:
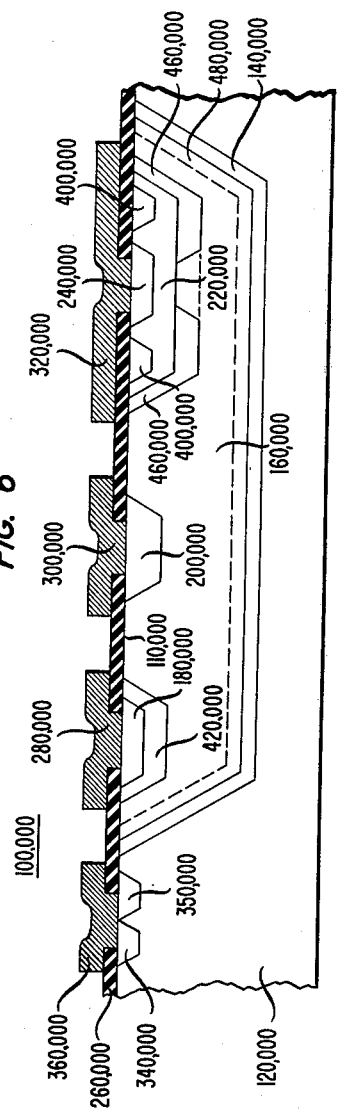
FIG. 6 illustrates still another structure.

Referring now to FIG. 6, there is illustrated a structure 100,000 which can be substituted for the GDSs of FIGS. 4 and 5. Structure 100,000 is illustrated and described in U.S. patent application Ser. No. 107,774 (A. R. Hartman-T. J. Riley-P. W. Shackle) which was filed Dec. 28, 1979, and is a continuation-in-part of Ser. No. 972,056 (A. R. Hartman-T. J. Riley-P. W. Shackle), filed Dec. 20, 1978. Structure 100,000 can be used for GDSA, GDSB, GDSA0, and GDSB0.

Switch structure 100,000 comprises a support member 120,000 having a major surface 110,000 and a monocrystalline semiconductor body 160,000 whose bulk is of relatively high resistivity and which is separated from support member 120,000 by a dielectric layer 140,000. An n type region 480,000 is sandwiched between support member 120,000 and body 160,000. Region 480,000 is optional.

A localized anode region 180,000, which is of p+ type conductivity, is included in body 160,000 and has a portion thereof that extends to surface 110,000. A p type region 420,000 surrounds anode region 180,000. A localized gate region 200,000, which is of n+ type conductivity, and a localized cathode region 240,000, which is of n+ type conductivity, are also included in body 160,000. A guard ring region 400,000, which is of p+ type conductivity, encircles cathode region 240,000. A region 220,000, which is of the p type conductivity and has a portion which extends to surface 110,000, encircles region 400,000 and cathode 240,000 and acts as a depletion layer punch-through shield. A region 460,000, which is of p-type conductivity, surrounds region 220,000. As is indicated by the dashed line between portions of region 460,000, region 460,000 can completely surround a bottom portion of region 220,000. Regions 400,000, 220,000, and 460,000 act to inhibit inversion of the portions of body 160,000 at or near surface 110,000 between regions 200,000 and 240,000. Gate region 200,000 is located between anode region 180,000 and region 220,000 and is separated from both by bulk portions of body 160,000. The resistivities of regions 180,000, 200,000, and 240,000 are low compared to that of the bulk portions of body 160,000. The resistivity of region 220,000 is intermediate between that of cathode region 240,000 and that of the bulk portion of body 160,000. The resistivity of region 460,000 is intermediate between that of region 220,000 and the bulk portion of semiconductor body 160,000.

Electrodes 280,000, 300,000 and 320,000 are conductors which make low resistance contact to the surface portions 110,000 of regions 180,000, 200,000, and 240,000, respectively. A dielectric layer 260,000 covers major surface 110,000 so as to isolate electrodes 280,000, 300,000, and 320,000 from all regions other than those intended to be electrically contacted. An electrode 360,000 provides a low resistance contact to support 120,000 by way of a highly doped region 340,000 which is of the same conductivitiy type as support 120,000.

Advantageously, the support 120,000 and the body 160,000 are each of silicon with the support 120,000 being either of n or p type conductivity. Each of electrodes 280,000, 300,000, and 320,000 advantageously overlaps the semiconductor region to which it makes low resistance contact. Electrode 320,000 also overlaps region 220,000. This overlapping, which is known as field plating, facilitates high voltage operation because it increases the voltage at which breakdown occurs.

A plurality of separate bodies 160,000 can be formed in a common support 120,000 to provide a plurality of switches.

Structure 100,000 is typically operated as a switch which is characterized by a low impedance path between anode region 180,000 and cathode region 240,000 when in the ON (conducting) state and as a high impedance between said two regions when in the OFF (blocking) state. With proper operating potentials applied to anode region 180,000 and cathode region 240,000, the potential applied to gate region 200,000 determines the state of the switch. Conduction between anode region 180,000 and cathode region 240,000 occurs if the potential of gate region 200,000 is below that of the shield region 220,000. During the ON state holes are injected into body 160,000 from anode region 180,000 and electrons are injected into body 160,000 from cathode region 240,000. The ON state can be achieved by applying proper operating potentials to the anode and cathode regions and forward-biasing the anode region with respect to the gate region. These holes and electrons exist in sufficient numbers to form a plasma which conductivity modulates body 160,000. This effectively lowers the resistance of body 160,000 such that the resistance between anode region 180,000 and cathode region 240,000 is relatively low when structure 100,000 is operating in the ON state. This type of operation is denoted as dual carrier injection.

Region 220,000 helps limit the punch-through of a depletion layer formed during operation between gate region 200,000 and cathode region 240,000 and helps inhibit formation of a surface inversion layer between these two regions. In addition, it facilitates gate region 200,000 and cathode region 240,000 being relatively closely spaced apart. This facilitates relatively low resistance between anode region 180,000 and cathode region 240,000 during the ON state.

Support 120,000 is typically held at the most positive potential level available. During the OFF state conduction between anode region 180,000 and cathode region 240,000 is inhibited or cut off if the potential of gate region 200,000 is sufficiently more positive than that of anode region 180,000, cathode region 240,000, and region 220,000. The amount of excess positive potential needed to inhibit or cut off conduction is a function of the geometry and impurity concentration (doping) levels of structure 100,000. This positive gate potential causes the portion of body 160,000 between gate region 200,000 and the dielectric layer 140,000 to be more positive in potential than anode region 180,000, cathode region 240,000, and/or region 220,000. This positive potential barrier inhibits the conduction of holes from region 180,000 to cathode region 240,000.

With the semiconductor body 160,000 and anode region 180,000 both being of p type conductivity, the structure 100,000 is one of the basic structures disclosed and described in U.S. patent application Ser. No. 972,056, filed Dec. 20, 1978, and in which there is a common assignee. In this structure, which is denoted as a gated diode switch (GDS) in the aforesaid copending application, the positive gate voltage causes a cross-sectional portion of semiconductor body between the gate region and the dielectric layer therebelow to be essentially depleted as well as the potential thereof being greater than that of the anode, cathode, and shield region. The positive potential of this cross-sectional portion of semiconductor body inhibits the conduction of holes from the anode region to the cathode region and serves to collect electrons emitted at the cathode region before they can reach the anode region.

With the semiconductor body 160,000 being of n type conductivity, and region 180,000 being of p type conductivity the structure 100,000 is the structure disclosed and described in U.S. patent application Ser. No. 107,775 (A. R. Hartman-T. J. Riley-P. W. Shackle), which has a common assignee and was filed Dec. 28, 1979. In this structure the positive gate potential causes depletion regions to form at the junction of the anode region and semiconductor body and at the junction of the shield region and semiconductor body. In addition this causes a vertical cross-sectional portion of the semiconductor body between the anode and cathode regions to be more positive in potential than the anode, cathode, and/or shield regions. The positive potential of this cross-sectional portion of semiconductor body inhibits conduction of holes from the anode region to the cathode region and serves to collect electrons emitted at cathode region before they can reach anode region.

All of the above-disclosed structures are high voltage switches that have separate anode, cathode, and gate regions, are characterized by dual carrier conduction, and are controlled in similar manners.

The embodiments described herein are intended to be illustrative of the general principles of the present invention. Various modifications are possible consistent with the spirit of the invention. For example, the breakdown voltages of the zener diodes can be varied to vary the potential difference at which terminals A, A0 and B, B0 are clamped. Still further, the zener diodes could be replaced with other devices which perform a similar function. Still further, GDSs other than the one described could be used. Still further, the values of the resistors R1, R10, R2, R20 can be varied and these resistors can take any form known to provide a suitable resistance and current carrying capability. Still further, R1 and R2 can be of different ohmic values as can be R10 and R20. Still further, the anodes of Z1, Z10 and Z2, Z20 can be connected to terminals A, A0 and B, B0, respectively. R1, R10 is then connected between the cathode of Z1, Z10 and the gates of GDSA, GDSA0 and GDSB, GDSB0, and R2, R20 is then connected between the cathode of Z2, Z20 and the gates of GDSA, GDSB and GDSA0 and GDSB0. Still further, the series combination of R1, R10 and Z1, Z10 can have R1, R10 and Z1, Z10 reversed and the combination of R2, R20 and Z2, Z20 can be as illustrated. The reverse situation can also exist.

We claim:

1. Circuitry to be connected to first and second circuit terminals across a load to be protected comprising:
    four diodes each having the characteristic that it passes little current therethrough below a threshold applied voltage and experiences a relatively constant voltage drop thereacross for increasing current therethrough;
    first and second switches each having first and second output terminals and a control terminal;
    first and second resistors;
    each switch being a device of the type comprising a semiconductor body having a bulk portion;
    a localized first region which is of the one conductivity type, and a localized second region and a localized third region which are both of the opposite conductivity type;
    each of the localized first, second, and third regions being of relatively low resistivity as compared to the bulk portion of the semiconductor body and being spaced apart from each other;
    the switch being adapted to selectively facilitate current flow between the first and third regions or to divert a sufficient portion of said current into the second region so as to substantially interrupt (cut off) said current flow between the first and third regions;
    the switch being also adapted to selectively substantially inhibit current from flowing between the first and third regions;
    the first resistor and the first diode are serially connected together and the combination of both is connected between the first terminal and the control terminals of the two switches;
    the second resistor and the second diode are serially connected together and the combination of both is connected between the second terminal and the control terminals of the two switches;
    the cathode and anode of the third diode are connected to the first circuit terminal and to the first output terminal of the first switch, respectively; and
    the cathode and anode of the fourth diode are connected to the second circuit terminal and to the first output terminal of the second switch, respectively.

2. The circuitry of claim 1 further comprising a first capacitor which is connected to the first circuit terminal and to the anode of the first diode, and by a second capacitor which is connected to the second circuit terminal and to the anode of the second diode.

3. The circuitry of claim 2 wherein the first, second, third, and fourth diodes are zener diodes.

4. The circuitry of claim 1 wherein the first output terminal of the first switch is coupled to the second output terminal of the second switch and the second output terminal of the first switch is coupled to the first output terminal of the second switch.

5. The circuitry of claim 4 wherein each switch is a gated diode switch with the anode being the first output terminal, the cathode being the second output terminal, and the gate being the control terminal.

6. Circuitry to be connected to first and second circuit terminals across a load to be protected comprising:
   four diodes each having the characteristic that it passes little current therethrough below a threshold applied voltage and experiences a relatively constant voltage drop thereacross for increasing current therethrough;
   first and second switches each having a first output terminal, a second output terminal, and a control terminal;
   each switch being a device of the type comprising a semiconductor body a bulk portion of which is of a relatively high resistivity, a first region of a first conductivity type and of a relatively low resistivity, a second region of a second conductivity type opposite that of the first conductivity type, the first and second regions being connected to output terminals of the switching device, a control region of the second conductivity type, the first, second and control regions being mutually separated by portions of the semiconductor body bulk portion, the parameters of the device being such that, with a first voltage applied to the control region, a potential is established within a cross-sectional portion of the bulk of the semiconductor body which is substantially different from that of the potential of the first and second regions and which substantially inhibits or interrupts current flow between the first and second regions, and that, with a second voltage applied to the control region and with appropriate voltages applied to the first and second regions, a relatively low resistance current path is established between the first and second regions by dual carrier injection;
   first and second resistors;
   the first resistor and the first diode are serially connected together and the combination of both is connected between the first circuit terminal and the control terminals of the two switches;
   the second resistor and the second diode are serially connected together and the combination of both is connected between the second circuit terminal and the control terminals of the two switches;
   the cathode and anode of the third diode are connected to the first circuit terminal and to the first output terminal of the first switch, respectively; and
   the cathode and anode of the fourth diode are connected to the second circuit terminal and to the first output terminal of the second switch (GDSB, GDSB0), respectively.

7. The circuitry of claim 6 wherein each switch is a gated diode switch with the anode being the first output terminal, the cathode being the second output terminal, and the gate being the control terminal.

8. Circuitry to be connected to first and second circuit terminals across a load to be protected comprising:
   four diodes each having the characteristic that it passes little current therethrough below a threshold applied voltage and experiences a relatively constant voltage drop thereacross for increasing current therethrough;
   first and second switches each having a first output terminal, a second output terminal, and a control terminal;
   each switch being a device of the type comprising a semiconductor body a bulk portion of which is of a relatively high resistivity, a first region of a first conductivity type and of a relatively low resistivity, a second region of a second conductivity type opposite that of the first conductvity type, the first and second regions being connected to the first and second output terminals, respectively, of the switch, a control region of the second conductivity type being connected to the control terminal of the switch, the first, second, and control regions being mutually separated by portions of the semiconductor body bulk portion comprising;
   first and second resistors;
   the first resistor and the first diode are serially connected together and the combination of both is connected between the first circuit terminal and the control terminals of the two switches;
   the second resistor and the second diode are serially connected together and the combination of both is connected between the second circuit terminal and the control terminals of the two switches;
   the cathode and anode of the third diode are connected to the first circuit terminal and to the first output terminal of the first switch, respectively; and
   the cathode and anode of the fourth diode are connected to the second circuit terminal and to the first output terminal of the second switch, respectively.

9. The circuitry of claim 8 wherein each switch is a gated diode switch with the anode being the first output terminal, the cathode being the second output terminal, and the gate being the control terminal.

* * * * *